United States Patent
Hidaka et al.

(10) Patent No.: US 12,094,690 B2
(45) Date of Patent: Sep. 17, 2024

(54) PLASMA PROCESSING APPARATUS

(71) Applicant: Tokyo Electron Limited, Tokyo (JP)

(72) Inventors: Koki Hidaka, Miyagi (JP); Hiroya Ogawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 240 days.

(21) Appl. No.: 17/874,349

(22) Filed: Jul. 27, 2022

(65) Prior Publication Data
US 2023/0029817 A1  Feb. 2, 2023

(30) Foreign Application Priority Data

Jul. 27, 2021 (JP) .................................. 2021-122392

(51) Int. Cl.
*H01J 37/32* (2006.01)
(52) U.S. Cl.
CPC ...... *H01J 37/32532* (2013.01); *H01J 37/321* (2013.01); *H01J 37/32449* (2013.01)
(58) Field of Classification Search
CPC .............. H01J 37/32532; H01J 37/321; H01J 37/32449; H01J 37/32522; H01J 37/3244; H01J 37/3255
See application file for complete search history.

(56) References Cited

U.S. PATENT DOCUMENTS

2005/0000442 A1*  1/2005  Hayashi ............ H01J 37/32009
                                                    118/723 E

FOREIGN PATENT DOCUMENTS

JP        2021-44535 A      3/2021

* cited by examiner

*Primary Examiner* — Courtney D Thomas
(74) *Attorney, Agent, or Firm* — XSENSUS LLP

(57) ABSTRACT

A plasma processing apparatus is disclosed, comprising: a plasma processing chamber; a substrate support disposed in the plasma processing chamber; a lower electrode disposed in the substrate support; at least one RF power source coupled to the lower electrode; an electromagnet unit disposed on or above the plasma processing chamber; and an upper electrode assembly, disposed above the substrate support, including: an insulating plate having a plasma exposed surface; a gas diffusion plate having a gas diffusion space; and an upper electrode plate, disposed between the insulating plate and the gas diffusion plate, including: a coolant inlet and a coolant outlet located at a location that is radially outward from the electromagnet unit; a coolant supply channel extending radially from the coolant inlet to a vicinity of the approximate center of the upper electrode plate; and a coolant return channel extending from the vicinity of the approximate center of the upper electrode plate to the coolant outlet.

11 Claims, 8 Drawing Sheets

PLASMA PROCESSING APPARATUS

CROSS-REFERENCE TO RELATED APPLICATION

This application claims priority to and the benefit of Japanese Patent Application No. 2021-122392, filed on Jul. 27, 2021, the disclosure of which is incorporated herein by reference in its entirety.

TECHNICAL FIELD

The present disclosure relates to a plasma processing apparatus.

BACKGROUND

Japanese Laid-open Patent Publication No. 2021-044535 discloses a configuration of a plasma processing apparatus including a chamber, an upper electrode, and an electromagnet assembly. The upper electrode closes an upper opening of the chamber. The electromagnet assembly is disposed on or above the chamber, and includes one or more annular coils. The electromagnet assembly is configured to generate magnetic field in the chamber.

SUMMARY

The technique of the present disclosure improves uniformity of plasma processing on a substrate by improving temperature uniformity of a plasma exposed surface of an upper electrode assembly.

To this end, a plasma processing apparatus is provided, comprising: a plasma processing chamber; a substrate support disposed in the plasma processing chamber; a lower electrode disposed in the substrate support; at least one RF power source coupled to the lower electrode; an electromagnet unit disposed on or above the plasma processing chamber; and an upper electrode assembly disposed above the substrate support, wherein the upper electrode assembly includes: an insulating plate having a plasma exposed surface; a gas diffusion plate having at least one gas diffusion space; and an upper electrode plate disposed between the insulating plate and the gas diffusion plate, and wherein the upper electrode plate includes: at least one coolant inlet and at least one coolant outlet disposed at a location that is radially outward from the electromagnet unit in plan view; at least one coolant supply channel extending radially from the at least one coolant inlet to a vicinity of the approximate center of the upper electrode plate in plan view; and one or more coolant return channels extending from the vicinity of the approximate center of the upper electrode plate to the at least one coolant outlet, each having a plurality of arc-shaped portions extending in a circumferential direction in plan view.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
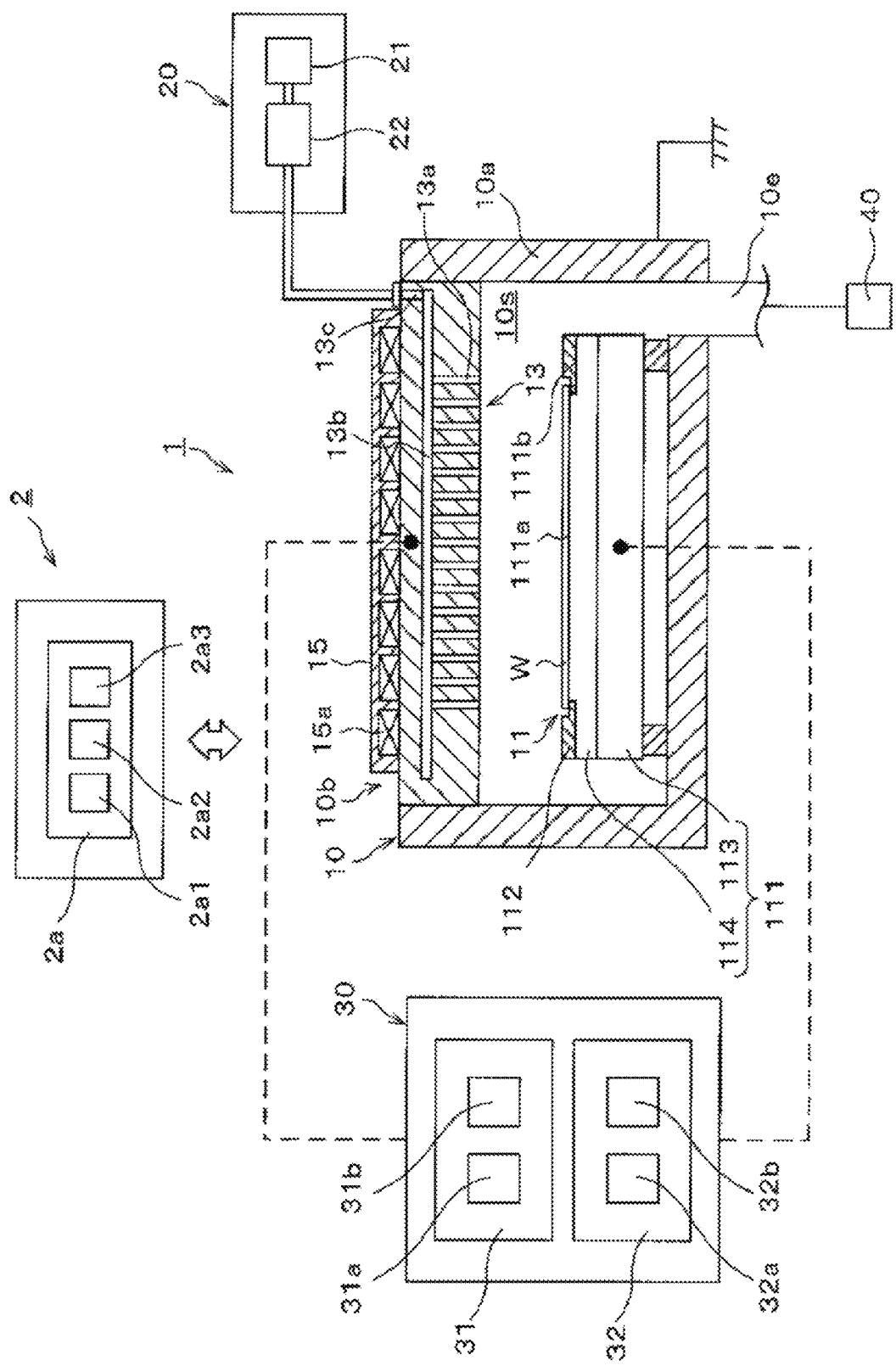
FIG. 1 is an explanatory diagram schematically showing a configuration of a plasma processing system.

Hereinafter, a plasma processing system including a plasma processing apparatus according to an embodiment will be described with reference to the accompanying drawings. Like reference numerals will be given to Like parts having substantially the same functions and configurations throughout this specification and the drawings, and redundant description thereof will be omitted.

<Plasma Processing System>

First, the plasma processing system according to the present embodiment will be described. FIG. 1 is a vertical cross-sectional view schematically showing a configuration of the plasma processing system according to the present embodiment.

The plasma processing system includes a capacitively coupled plasma processing apparatus 1 and a controller 2. The plasma processing apparatus 1 includes a plasma processing chamber 10, a gas supply 20, a power supply 30, and an exhaust system 40. Further, the plasma processing apparatus 1 includes a substrate support 11 and a gas introduction unit. The substrate support 11 is disposed in the plasma processing chamber 10. The gas introduction unit is configured to introduce at least one processing gas into the plasma processing chamber 10. The gas introduction unit includes an upper electrode assembly 13. The upper electrode assembly 13 is disposed above the substrate support 11. In one embodiment, the upper electrode assembly 13 is disposed at an upper portion of the plasma processing chamber 10, and forms at least a part of a ceiling plate 10b (ceiling). An electromagnet unit 15 having therein a coil 15a is disposed on or above the plasma processing chamber 10.

A plasma processing space 10s defined by the upper electrode assembly 13 (the ceiling plate 10b), a sidewall 10a of the plasma processing chamber 10, and the substrate support 11 is formed in the plasma processing chamber 10. The plasma processing chamber 10 has at least one gas inlet for supplying at least one processing gas to the plasma processing space 10s, and at least one gas outlet for exhausting a gas from the plasma processing space 10s. The sidewall 10a is grounded. The upper electrode assembly 13 and the substrate support 11 are electrically isolated from the plasma processing chamber 10.

The substrate support 11 includes a main body 111 and a ring assembly 112. The upper surface of the main body 111 has a central region 111a (substrate supporting surface) for supporting the substrate (wafer) W and an annular region 111b (ring supporting surface) for supporting the ring assembly 112. The annular region 111b surrounds the central region 111a in plan view. The ring assembly 112 includes one or more annular members, at least one of which is an edge ring.

In one embodiment, the main body 111 includes a base 113 and an electrostatic chuck 114. The base 113 includes a conductive member. The conductive member of the base 113 functions as a lower electrode. The electrostatic chuck 114 is disposed on the upper surface of the base 113. The upper surface of the electrostatic chuck 114 has the central region 111a and the annular region 111b.

Although not shown, the substrate support 11 may include a temperature control module configured to adjust at least one of the ring assembly 112, the electrostatic chuck 114, and the substrate W to a target temperature. The temperature control module may include a heater, a heat transfer medium, a flow path, or a combination thereof. A heat transfer fluid, such as brine or a gas, flows through the flow path. The substrate support 11 may include a heat transfer gas supply configured to supply a heat transfer gas (backside gas) to a gap between the backside of the substrate W and the upper surface of the electrostatic chuck 114.

The gas supply 20 may include at least one gas source 21 and at least one flow controller 22. In one embodiment, the gas supply 20 is configured to supply at least one processing gas from the corresponding gas source 21 to the upper electrode assembly 13 through the corresponding flow controller 22. The flow controllers 22 may include, e.g., a mass flow controller or a pressure-controlled flow controller. Further, the gas supply 20 may include one or more flow modulation devices for modulating the flow of at least one processing gas or causing it to pulsate.

The power supply 30 includes an RF power supply 31 coupled to the plasma processing chamber 10 through at least one impedance matching circuit. The RF power supply 31 is configured to supply at least one RF signal (RF power), such as a source RF signal and a bias RF signal, to the conductive member (lower electrode) of the substrate support 11 and/or the conductive member (upper electrode) of the upper electrode assembly 13. Accordingly, a plasma is produced from at least one processing gas supplied to the plasma processing space 10s. Therefore, the RF power supply 31 may function as at least a part of a plasma generator configured to produce plasma from one or more processing gases in the plasma processing chamber 10. Further, by supplying the bias RF signal to the lower electrode, a bias potential is generated at the substrate W, and ions in the produced plasma can be attracted to the substrate W.

In one embodiment, the RF power supply 31 includes a first RF generator 31a and a second RF generator 31b. The first RF generator 31a is coupled to the lower electrode and/or the upper electrode through at least one impedance matching circuit, and is configured to generate a source RF signal (source RF power) for plasma generation. In one embodiment, the source RF signal has a frequency in a range of 13 MHz to 160 MHz. In one embodiment, the first RF generator 31a may be configured to generate a plurality of source RF signals having different frequencies. One or more source RF signals so generated are supplied to the lower electrode and/or the upper electrode. The second RF generator 31b is coupled to the lower electrode through at least one impedance matching circuit and is configured to generate a bias RF signal (bias RF power). In one embodiment, the bias RF signal has a frequency lower than that of the source RF signal. In one embodiment, the bias RF signal has a frequency in a range of 400 kHz to 13.56 MHz. In one embodiment, the second RF generator 31b may be configured to generate a plurality of bias RF signals having different frequencies. One or more bias RF signals so generated are supplied to the lower electrode. Further, in various embodiments, at least one of the source RF signal and the bias RF signal may pulsate.

The power supply 30 may include a DC power supply 32 coupled to the plasma processing chamber 10. The DC power supply 32 includes a first DC generator 32a and a second DC generator 32b. In one embodiment, the first DC generator 32a is connected to the lower electrode, and is configured to generate a first DC signal. The first bias DC signal so generated is applied to the lower electrode. In one embodiment, the first DC signal may be applied to another electrode, such as an attraction electrode in the electrostatic chuck 114. In one embodiment, the second DC generator 32b is connected to the upper electrode, and is configured to generate a second DC signal. The second DC signal so generated is applied to the upper electrode. In various embodiments, at least one of the first and second DC signals may pulsate. The first and second DC generators 32a and 32b may be provided in addition to the RF power supply 31, and the first DC generator 32a may be provided instead of the second RF generator 31b.

The exhaust system 40 may be connected to a gas outlet 10e disposed at a bottom portion of the plasma processing chamber 10, for example. The exhaust system 40 may include a pressure control valve and a vacuum pump. The pressure control valve adjusts the pressure in the plasma processing space 10s. The vacuum pump may include a turbo molecular pumps, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, a part or all of the controller 2 may be included in the plasma processing apparatus 1. The controller 2 may include, e.g., a computer 2a. The computer 2a may include, e.g., a central processing unit (CPU) 2a1, a storage device 2a2, and a communication interface 2a3. The central processing unit 2a1 may be configured to perform various control operations based on a program stored in the storage device 2a2. The storage device 2a2 may include a random access memory (RAM), a read only memory (ROM), a hard disk drive (HDD), a solid state drive (SD), or a combination thereof. The communication interface 2a3 may communicate with the plasma processing apparatus 1 through a communication line such as a local area network (LAN) or the like.

<Upper Electrode Assembly>

Figure 2:
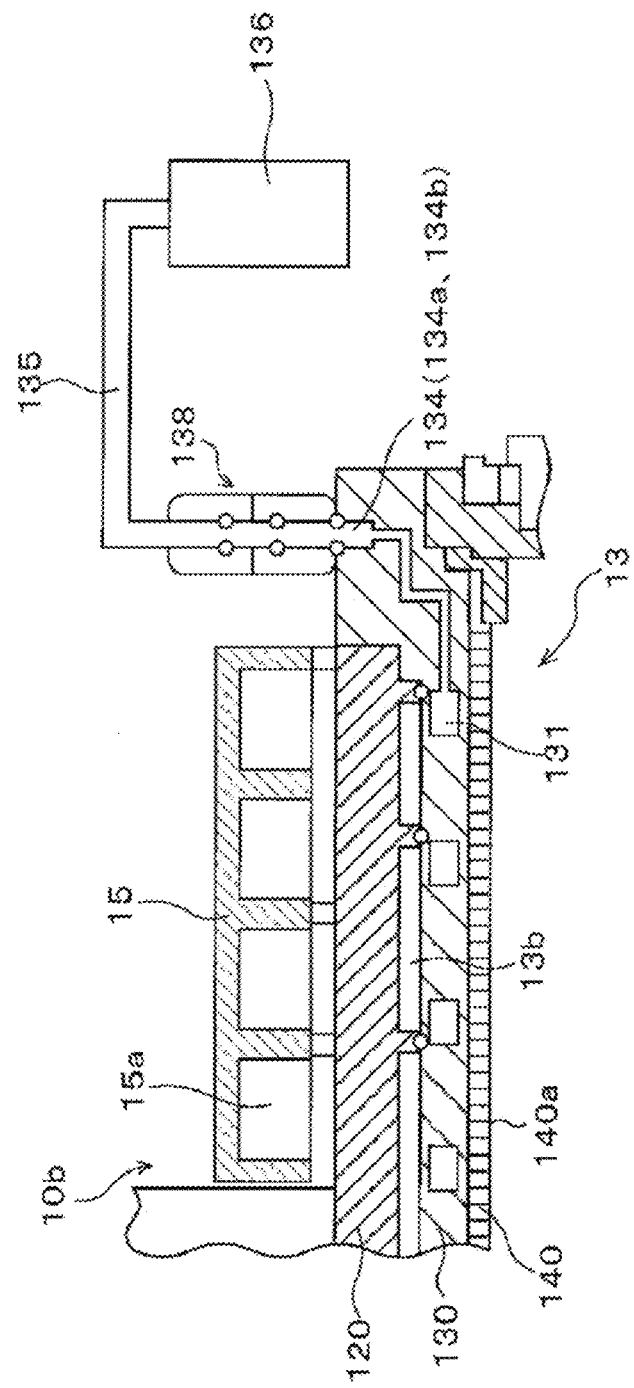
FIG. 2 is an enlarged explanatory diagram showing a part of an upper electrode assembly.

Next, the above-described upper electrode assembly 13 and the components of the plasma processing apparatus 1 that are related to the upper electrode assembly 13 will be described with reference to FIG. 1 or 2. FIG. 2 is an enlarged explanatory diagram showing a part of the upper electrode assembly 13.

As shown in FIG. 2, the upper electrode assembly 13 constitutes a part or all of the ceiling plate 10b of the plasma processing chamber 10, and includes a gas diffusion plate 120, an upper electrode plate 130, and an insulating plate 140. The upper electrode plate 130 is disposed between the gas diffusion plate 120 and the insulating plate 140, such that they are laminated in a vertical direction. In other words, the upper electrode assembly 13 includes the gas diffusion plate 120, the upper electrode plate 130, and the insulating plate 140 in that order from the top. At least one gas diffusion space 13b may be formed between the gas diffusion plate 120 and the upper electrode plate 130.

The upper electrode plate 130 is made of a first conductive material. The gas diffusion plate 120 is made of a second conductive material. The second conductive material may be the same as or different from the first conductive material. In one embodiment, the first conductive material and the second conductive material are Al (aluminum). The insulating plate 140 is made of an insulating material such as quartz or the like. The bottom surface of the insulating plate 140 serves as a plasma exposed surface 140a exposed to the plasma processing space 10s. Therefore, the insulating plate 140 has the plasma exposed surface 140a. A plurality of gas inlet ports 13a (not shown in FIG. 2) are formed through the upper electrode plate 130 and the insulating plate 140 in a thickness direction (vertical direction) thereof. The gas inlet ports 13a are connected to the gas supply 20 through a gas diffusion space 13b and a gas inlet 13c (not shown in FIG. 2), and are configured to introduce at least one processing gas from the gas supply 20 into the plasma processing space 10s.

The electromagnet unit 15 having therein the coil. 15a is disposed on or above the ceiling plate 10b of the plasma processing chamber 10. In one embodiment, the electromagnet unit 15 substantially has a circular shape in plan view. The electromagnet unit 15 is configured to generate magnetic field in the plasma processing chamber 10 by allowing a current from an external current source (not shown) to flow in the coil 15a. The power supply 30 shown in FIG. 1 may be used as the power supply for the electromagnet unit 15. Various configurations can be applied to the electromagnet unit 15. For example, the configuration described in Japanese Laid-open Patent Publication No. 2021-044535 may be applied to the electromagnet unit 15.

The upper electrode plate 130 has therein at least one coolant channel 131 configured to adjust the temperature of the insulating plate 140, the temperature of which varies due to a heat input from plasma, to a target temperature. A coolant (heat transfer fluid), such as brine or a gas, flows in the coolant channel 131, circulating between the coolant channel 131 and a chiller 136 disposed outside the apparatus, through a coolant inlet/outlet 134 disposed at a side portion (peripheral portion) of the upper electrode plate 130. In one embodiment, a seal member 138 for supporting a supply line 135 and sealing a connection point between the supply line 135 and the coolant inlet/outlet 134 is disposed at the peripheral portion of the upper electrode plate 130. A plurality of coolant inlets/outlets 134 may be disposed. Coolant inlets 134a and coolant outlets 134b may be disposed at substantially the same position or at different positions. The specific shape of the coolant channel 131 will be described later with reference to the drawings.

Here, the electromagnet unit 15 is disposed on or above the ceiling plate 10b of the plasma processing chamber 10 as illustrated in the drawing. Therefore, the coolant inlet/outlet 134 is designed to be disposed on the peripheral portion, at a location that is radially outward from the electromagnet unit 15 in plan view (in a radial direction). FIG. 2 is an enlarged view of a part of the upper electrode assembly 13. Although the coolant inlet/outlet 134 is disposed at only one location in FIG. 2, the coolant inlet/outlet 134 may be disposed at two or more locations. For example, the coolant inlet/outlet 134 may be disposed at both ends in plan view.

The insulating plate 140 has the plasma exposed surface 140a, and becomes hot due to the heat input from plasma from the plasma processing space 10s to the plasma exposed surface 140a. Due to the configuration of the upper electrode assembly 13, the peripheral portion is easier to be heated than the radially central portion, so that the temperature of the insulating plate 140 tends to be higher at the central portion than at the peripheral portion. The insulating plate 140 is a thin member having a thickness of about 5 mm, for example, and it is difficult to form a channel in the insulating plate 140. Therefore, a configuration in which the coolant channel 131 is formed in the upper electrode plate 130 disposed above the insulating plate 140 to control a temperature of the insulating plate 140 is adopted.

<Substrate Processing Method Using Plasma Processing Apparatus>

Next, an example of a method for processing the substrate W in the plasma processing apparatus 1 configured as described above will be described. In the plasma processing apparatus 1, various plasma processing such as etching, film formation, diffusion and the like are performed on the substrate W.

First, the substrate W is loaded into the plasma processing chamber 10 and placed on the electrostatic chuck 114 of the substrate support 11. Next, a voltage is applied to the attraction electrode of the electrostatic chuck 114, so that the substrate W is attracted and held on the electrostatic chuck 114 by an electrostatic force.

When the substrate W is attracted and held on the electrostatic chuck 114, a pressure in the plasma processing chamber 10 is decreased to a vacuum level. Next, the processing gas is supplied from the gas supply 20 to the plasma processing space 10s via the upper electrode assembly 13. The source RF power for plasma generation is supplied from the first RF generator 31a to the upper electrode or the lower electrode. Accordingly, the processing gas is excited, and plasma is produced. The bias RF power may be supplied from the second RF generator 31b. In the plasma processing space 10s, the substrate W is subjected to plasma processing by the action of the produced plasma. At this point, electric field is generated in the plasma processing space 10s by the electromagnet unit 15.

Here, during the plasma processing performed on the substrate W, the temperature of the insulating plate 140 of the upper electrode assembly 13 disposed adjacent to the plasma processing space 10s varies due to the heat input from the plasma.

Therefore, in the present embodiment, the temperature of the insulating plate 140 is controlled by the coolant channel 131 in the upper electrode plate 130. Specifically, for example, when the temperature of the insulating plate 140 increases due to the heat input from the plasma, the temperature of the upper electrode plate 130 is lowered by circulating a heat transfer fluid in the coolant channel 131. Accordingly, the heat transfer from the insulating plate 140 to the upper electrode plate 130 is promoted, thereby lowering the temperature of the insulating plate 140.

When the plasma processing is completed, the supply of the source RF power from the first RF generator 31a and the supply of the processing gas from the gas supply 20 are stopped. In the case of suppling the bias RF power during the plasma processing, the supply of the bias RF power is also stopped.

Next, the attraction and holding of the substrate W an the electrostatic chuck 114 is stopped, and the substrate W that has been subjected to the plasma processing and the electrostatic chuck 114 are neutralized. Then, the substrate W is separated from the electrostatic chuck 114, and taken out from the plasma processing apparatus 1. In this manner, a series of plasma processing is completed.

<Coolant Channel>

Figure 3:
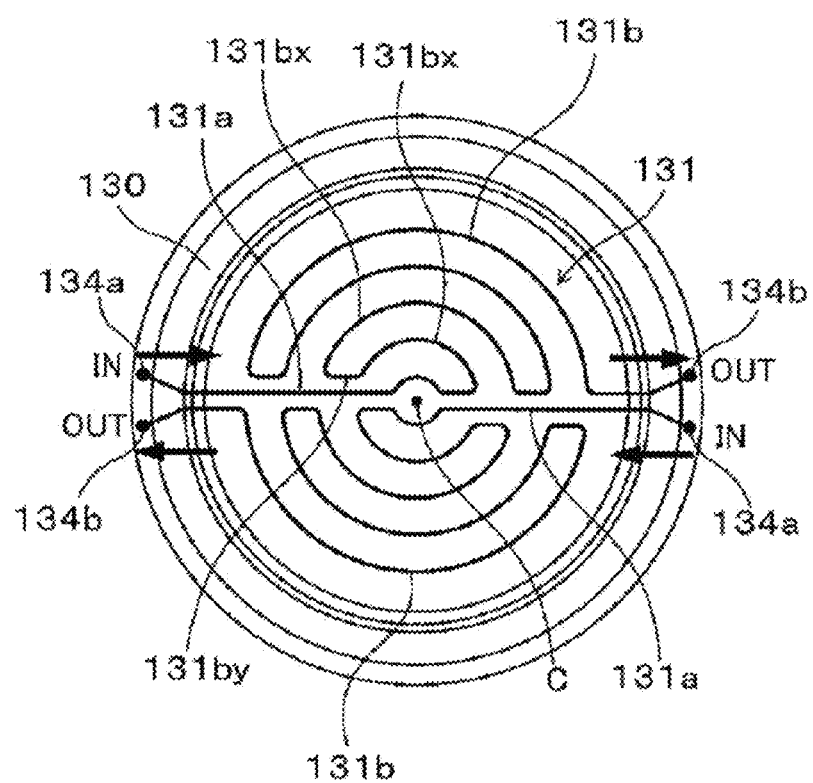
FIG. 3 is a conceptual diagram of a configuration of a coolant channel.

Hereinafter, a specific configuration of the above-described coolant channel 131 will be described with reference to the drawings. FIG. 3 is a conceptual diagram of a configuration of the coolant channel 131.

In the device configuration including the electromagnet unit 15 disposed on or above the ceiling plate 10b of the plasma processing chamber 10, unlike the device configuration that does not include the electromagnet unit 15, the coolant inlet/outlet 134 is disposed at the peripheral portion of the upper electrode plate 130. In other words, the coolant inlet/outlet 134 is disposed at a location that is radially outward from the electromagnet unit 15 in plan view.

As shown in FIG. 3, in the configuration according to the present embodiment, the coolant supplied from the coolant inlet IN (the coolant inlet 134a) is supplied to the radial center so as to flow the substantially shortest distance, and flows from the radial center toward the coolant outlet OUT (the coolant outlet 134b). In the configuration according to the present embodiment, as illustrated in the drawing, the forward path (the coolant supply channel 131a) in the coolant channel 131 is disposed along the radial direction of the upper electrode plate 130 in plan view. Further, the backward path (the coolant return channel 131b) in the coolant channel 131 is disposed on the entire surface of the upper electrode plate 130 in plan view. In other words, the coolant supply channel 131a has a substantially linear shape in the radial direction of the upper electrode plate 130 and has the shortest distance in plan view, and the coolant return channel 131b has a meandering shape to extend over a maximum range of the upper electrode plate 130 in plan view. Here, the "meandering shape" is a shape in which a plurality of annular channels having different diameters are connected to each other, for example. Further, the "substantially linear shape" is a shape in which the channel extends linearly in the radial direction and may partially have some curved portions, for example.

Figure 4A:
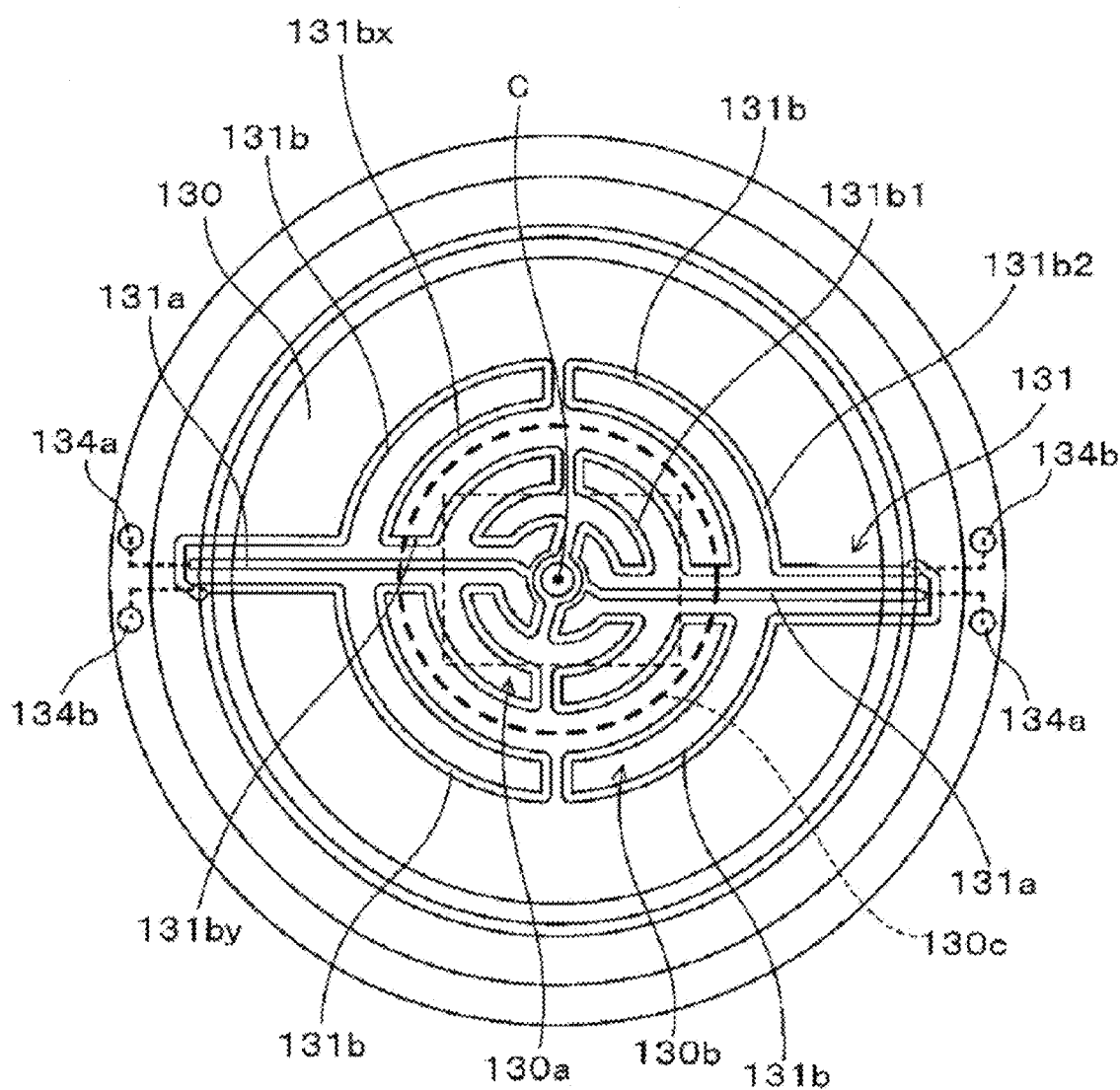
FIG. 4A shows the coolant channel.
Figure 4B:
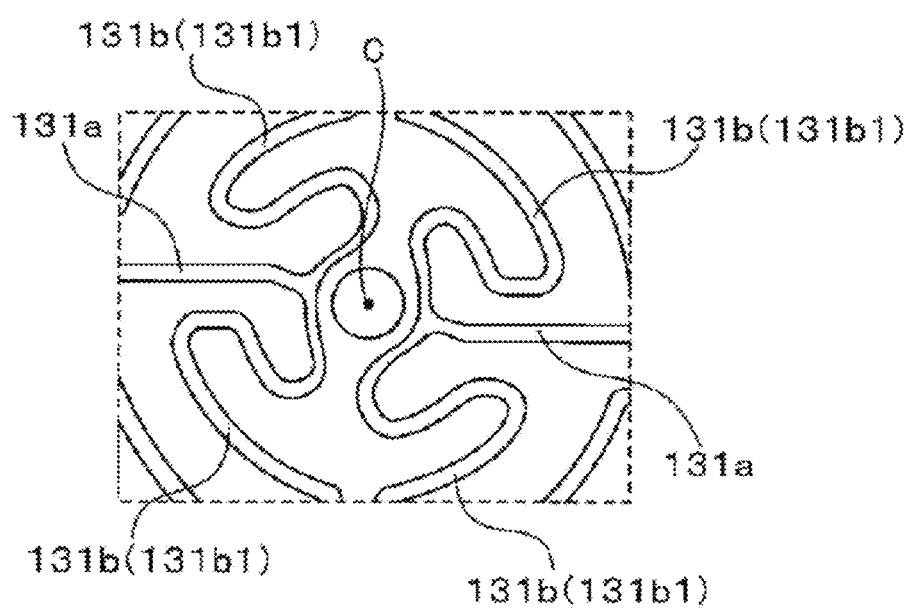
FIG. 4B is a partially enlarged view of the coolant channel.

FIG. 4A shows the coolant channel. FIG. 4B is an enlarged view of a part of the coolant channel (portion indicated by rectangular broken lines).

In one embodiment, the upper electrode plate 130 has a circular shape in plan view, and has at least one coolant inlet 134a and at least one coolant outlet 134b located at a location that is radially outward from the electromagnet unit 15 in plan view. In the example of FIGS. 3 and 4A, at least one coolant inlet 134a comprises two coolant inlets 134a and 134a at both sides of the upper electrode plate 130, and at least one coolant outlet 134b comprises two coolant outlets 134b and 134b at both sides of the upper electrode plate 130.

Further, the upper electrode plate 130 has at least one coolant supply channel 131a extending in the radial direction from at least one coolant inlet 134a to the vicinity of an approximate center C of the upper electrode plate 130 in plan view. The coolant supply channel 131a is formed in a substantially linear shape. In the examples of FIGS. 3 and 4A, at least one coolant supply channel 131a comprises two coolant supply channels 131a and 131a respectively extending from the right coolant inlet 134a and the left coolant inlet 134a toward the vicinity of the approximate center C of the upper electrode plate 130.

Further, the upper electrode plate 130 has one or more coolant return channels 131b extending from the vicinity of the approximate center C of the upper electrode plate 130 to at least one coolant outlet 134b. Each coolant return channel 131b has a plurality of arc-shaped portions 131bx extending in the circumferential direction in plan view, and a plurality of folded portions 131by that connect two arc-shaped portions 131bx adjacent to each other in the radial direction. In one embodiment, the plurality of arc-shaped portions 131bx are arranged on the circumferences of a plurality of circles having different diameters, and the folded portions 131by connect the inner arc-shaped portion 131bx and the outer arc-shaped portion 131bx.

In the example of FIGS. 3 and 4A, the plurality of coolant return channels 131b comprise two coolant return channels 131b extending in opposite directions. In FIGS. 3 and 4A, the left coolant return channel 131b is connected to the right coolant supply channel 131a in the vicinity of the approximate center C of the upper electrode plate 130, and is connected to the left coolant outlet 134b. Further, in FIGS. 3 and 4A, the plurality of coolant return channels 131b comprise two coolant return channels 131b extending in opposite directions. The right coolant return channel 131b is connected to the left coolant supply channel 131a in the vicinity of the approximate center C of the upper electrode plate 130, and is connected to the right coolant outlet 134b.

In one embodiment, the plurality of coolant return channels 131b are branched from at least one coolant supply channel 131a in the vicinity of the approximate center C of the upper electrode plate 130. In the example of FIGS. 3 and 4A, the plurality of coolant return channels 131b comprise two left coolant return channels 131b and 131b branched from the left coolant supply channel 131a in the vicinity of the approximate center C of the upper electrode plate 130. These two left coolant return channels 131b and 131b join in the vicinity of the left coolant outlet 134b, and are connected to the left coolant outlet 134b. Further, in FIGS. 3 and 4A, the plurality of coolant return channels 131b comprise two right coolant return channels 131b and 131b branched from the right coolant supply channel 131a in the vicinity of the approximate center C of the upper electrode plate 130. These two right coolant return channels 131b and 131b join in the vicinity of the right coolant outlet. 134b, and are connected to the right coolant outlet 134b. Therefore, the plurality of coolant return channels 131b are connected to at least one coolant supply channel 131a in the vicinity of the approximate center C of the upper electrode plate 130.

Further, as shown in FIG. 4A, in one embodiment, the upper electrode plate 130 may have a central portion 130a near the center thereof and an annular portion 130b located at the outer edge of the central portion 130a. In other words, the upper electrode plate 130 has the central portion 130a and the annular portion 130b surrounding the central portion 130a. In one embodiment, in the coolant return channel 131b of the coolant channel 131, the channel portion located at the central portion 130a and the channel portion located at the annular portion 130b may have different densities. In other words, in the coolant channel 131, the areal ratio of the coolant channel in the central portion 130a in plan view may be greater than the areal ratio of the coolant channel in the annular portion 130b in plan view. Further, the distance between the channels at the central portion 130a may be smaller than the distance between the channels at the annular portion 130b. As shown in FIG. 4A, in one embodiment, the areal ratio of the plurality of coolant return channels 131b in the central portion 130a is greater than the areal ratio of the plurality of coolant return channels 131a in the annular portion 130b.

The area of the central portion 130a and the annular portion 130b in the upper electrode plate 130 can be arbitrarily designed, and can be arbitrarily designed depending on the temperature distribution required for the plasma exposed surface 140a of the insulating plate 140. For example, the portion corresponding to the portion where the temperature of the insulating plate 140 increases considerably may be defined as a substantially circular shape (portion indicated by a circular broken line in the drawing), and the inner side and the outer side of a boundary line 130c may be defined as the central portion 130a and the annular portion 130b, respectively.

Figure 5:
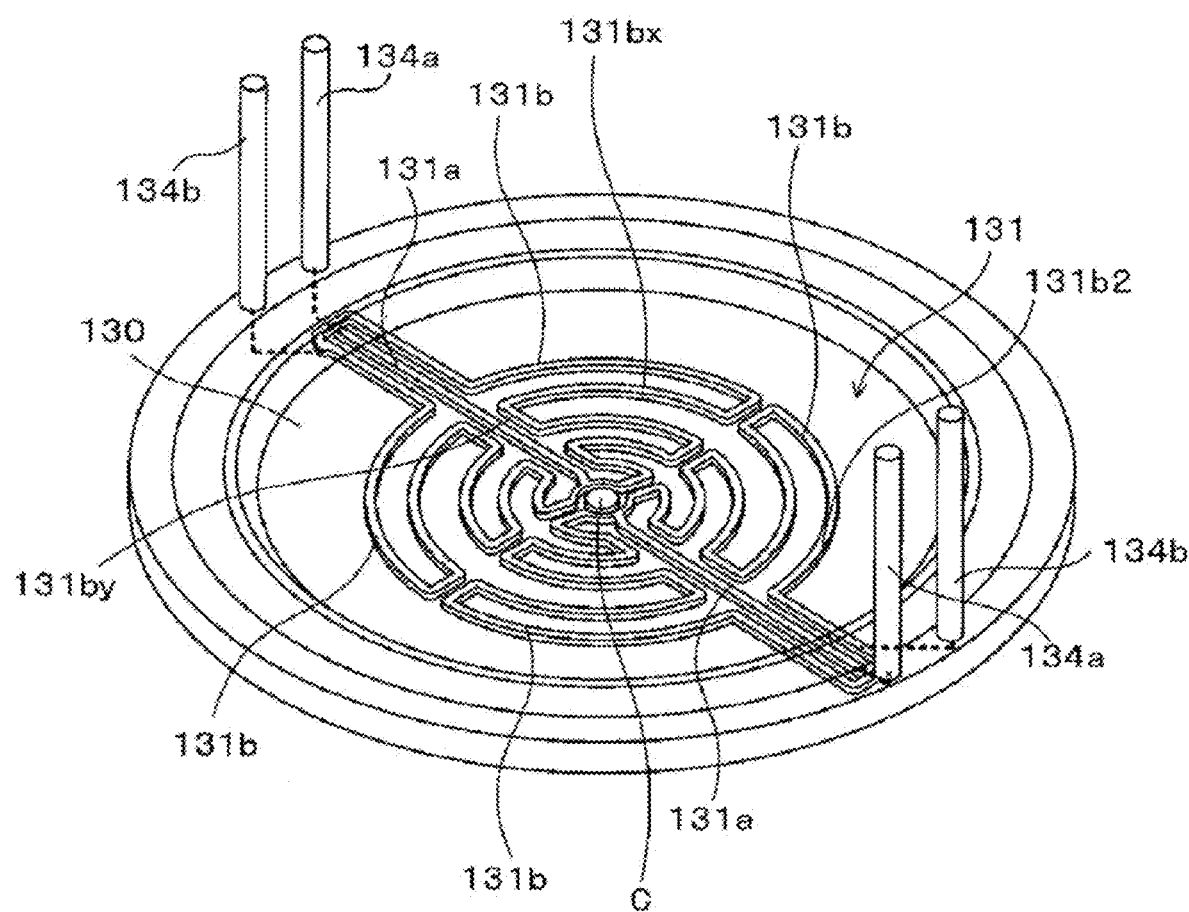
FIG. 5 is a schematic bird's eye view of the coolant channel.

Further, in the coolant channel 131, the heights of the coolant supply channel 131a and the coolant return channel 131b can be arbitrarily designed. FIG. 5 is a schematic bird's eye view of the coolant channel 131. As shown in FIG. 5, in the coolant channel 131, the height of one or more coolant supply channels 131a may be the same as the height of at least one coolant return channel 131b. Alternatively, in the coolant channel 131, the height of at least one coolant supply channel 131a may be greater than the height of one or more coolant return channels 131b.

Figure 6A:
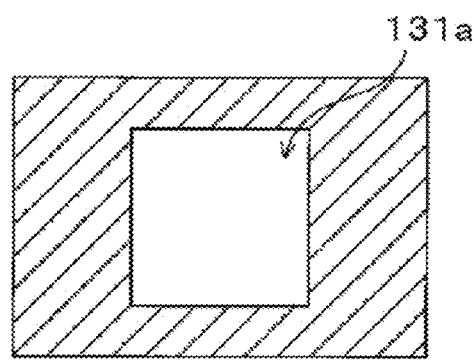
FIG. 6A is a general cross-sectional view of a coolant channel.
Figure 6B:
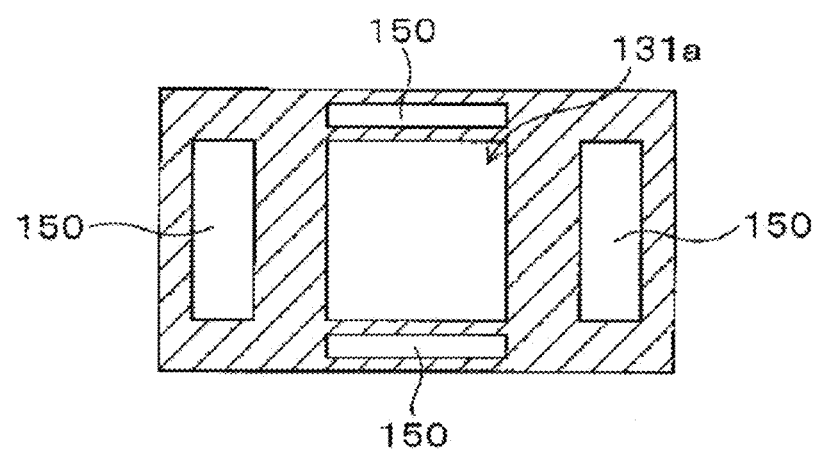
FIG. 6B is a cross-sectional view of a coolant channel having heat insulating portions.

Further, in one embodiment, heat insulating portions may be disposed around the coolant channel 131 in cross-sectional view. FIGS. 6A and 6B explain a configuration in which heat insulating portions are disposed around the coolant channel 131. FIG. 6A shows a general cross-sectional view of a coolant channel, and FIG. 6B shows a cross-sectional view of a coolant channel having heat insulating portions.

In one embodiment, the upper electrode plate 130 has one or more heat insulating portions 150 formed in the vicinity of at least one coolant supply channel 131a. The arrangement of the heat insulating portions 150 is arbitrary. For example, among the four heat insulating portions 150 shown in FIG. 6B, one or more heat insulating portions 150 may be formed in the vicinity of the coolant supply channel 131a. Further, in one embodiment, the upper electrode plate 130 has one or more heat insulating portions 150 formed around at least one coolant supply channel 131a. For example, as shown in FIG. 6B, four heat insulating portions 150 may be formed to surround the coolant supply channel 131a, i.e., to surround the top, the bottom, the left side, and the right side of the coolant supply channel 131a. Alternatively, one annular heat insulating portion 150 may be formed to surround the coolant supply channel 131a.

One or more heat insulating portions 150 are configured to block or reduce heat exchange between at least one coolant supply channel 131a and the upper electrode plate 130. The heat insulating portion 150 is also referred to as "thermal break". In one embodiment, one or more heat insulating portions 150 are one or more cavities formed in the upper electrode plate 130. Further, the heat insulating material may be arranged in one or more cavities.

In the configuration according to the present embodiment, the heat insulating portion 150 may be disposed only in the vicinity of or around the coolant supply channel 131a of the coolant channel 131, and the coolant return channel 131b may have a general cross-section shown in FIG. 6A. Accordingly, it is possible to suppress an increase in the coolant temperature in the coolant supply channel 131a of the coolant channel 131, and also possible to improve the cooling efficiency in the coolant return channel 131b.

As described above with reference to FIGS. 3 and 4, in the configuration according to the present embodiment, the coolant supply channel 131a of the coolant channel 131 has a substantially linear shape toward the radial center of the upper electrode plate 130 and has the shortest distance. Further, the coolant return channel 131b of the coolant channel 131 has a meandering shape to extend over a maximum range of the upper electrode plate 130. Further, the above-described heat insulating portions 150 are provided to suppress an increase in the coolant temperature in the coolant supply channel 131a. Accordingly, the upper electrode plate 130 can be more effectively cooled at the central portion (e.g., the central portion 130a in FIG. 4A) than at the peripheral portion (e.g., the annular portion 130b in FIG. 4A). Further, the insulating plate 140 in contact with the upper electrode plate 130 can be cooled while ensuring the same cooling distribution.

Figure 7A:
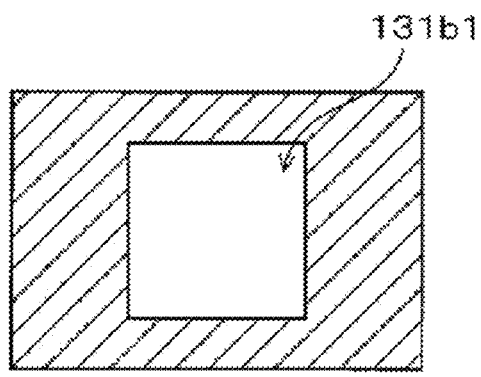
FIG. 7A is a general cross-sectional view of a coolant channel.
Figure 7B:
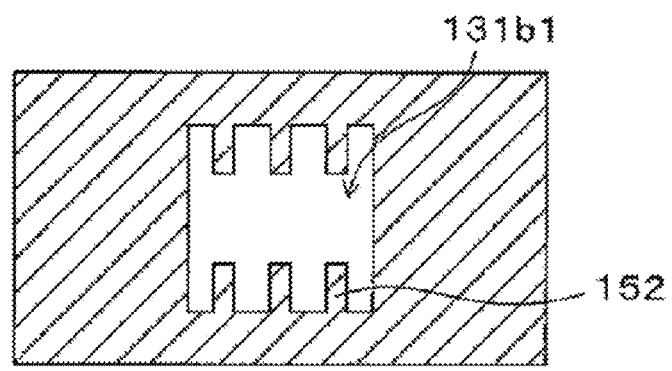
FIG. 7B is a cross-sectional view of a coolant channel having grooves.

Further, in one embodiment, a plurality of grooves may be formed in the cross-section of the coolant channel 131 to increase the heat exchange area thereof. FIGS. 7A and 7B explain a configuration in which a plurality of grooves are formed in the cross-section of the coolant channel 131. FIG. 7A is a general cross-sectional view of a coolant channel, and FIG. 7B is a cross-sectional view of a coolant channel having grooves.

As shown in FIG. 4A, in one embodiment, the plurality of coolant return channels 131b includes a plurality of first segments 131b1 formed at the central portion 130a and a plurality of second segments 131b2 formed at the annular portion 130b. Each of the plurality of first segments 131b1 has a plurality of grooves 152 shown in FIG. 7B. No groove is formed in any of the plurality of second segments 131b2.

As shown in FIG. 7B, the plurality of grooves 152 are disposed in the cross-section of the channel of the first segment 131b1. In the example of FIG. 7B, the plurality of grooves 152 are disposed at the upper portion and the lower portion of the first segment 131b1, but the arrangement of the plurality of grooves 152 is arbitrary. In the configuration according to one embodiment, as described above, each of the plurality of first segments 131b1 may have the grooves 152, and each of the plurality of second segments 131b2 may have a general cross-section shown in FIG. 7A. Accordingly, the upper electrode plate 130 can be cooled more effectively at the central portion (e.g., the central portion 130a in FIG. 4A) than at the peripheral portion (e.g., the annular portion 130b in FIG. 4A), and the insulating plate 140 can also be cooled while ensuring the same cooling distribution.

Operation and Effect of Present Embodiment

In the above embodiment, in the upper electrode assembly 13, the coolant channel 131 having a shape or configuration corresponding to temperature distribution of the insulating plate 140, the temperature of which varies in response to a heat input from plasma, is disposed in the upper electrode assembly 130 in contact with the insulating plate 140. Accordingly, the in-plane uniformity of the surface temperature of the insulating plate 140 can be realized.

Particularly, in the plasma processing apparatus 1 including the electromagnet unit 15, the coolant inlet/outlet 134 may be located at a location that is radially outward from the electromagnet unit 15. Even with this configuration, the upper electrode plate 130 can be cooled more effectively at the central portion than at the peripheral portion, and the insulating plate 140 can be cooled while ensuring uniform cooling distribution.

In other words, by effectively cooling the insulating plate 140 and realizing in-plane uniformity of the surface temperature of the insulating plate 140, the uniformity of the plasma processing on the substrate can be improved.

The embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:
a plasma processing chamber;
a substrate support disposed in the plasma processing chamber;
a lower electrode disposed in the substrate support;
at least one RF power source coupled to the lower electrode;
an electromagnet unit disposed on or above the plasma processing chamber; and
an upper electrode assembly disposed above the substrate support,
wherein the upper electrode assembly includes:
an insulating plate having a plasma exposed surface;
a gas diffusion plate having at least one gas diffusion space; and
an upper electrode plate disposed between the insulating plate and the gas diffusion plate, and wherein the upper electrode plate includes:
at least one coolant inlet and at least one coolant outlet disposed at a location that is radially outward from the electromagnet unit in plan view;
at least one coolant supply channel extending radially from the at least one coolant inlet to a vicinity of the approximate center of the upper electrode plate in plan view; and
one or more coolant return channels extending from the vicinity of the approximate center of the upper electrode plate to the at least one coolant outlet, each having a plurality of arc-shaped portions extending in a circumferential direction in plan view.

2. The plasma processing apparatus of claim 1, wherein the upper electrode plate has a central portion and an annular portion surrounding the central portion, and an areal ratio of the one or more coolant return channels in the central portion is greater than an areal ratio of the one or more coolant return channels in the annular portion.

3. The plasma processing apparatus of claim 1, wherein the height of the one or more coolant return channels is the same as the height of the at least one coolant supply channel.

4. The plasma processing apparatus of claim 1, wherein the height of the at least one coolant supply channel is greater than the height of the one or more coolant return channels.

5. The plasma processing apparatus of claim 1, wherein the insulating plate is made of quartz, and
the upper electrode plate is made of a first conductive material.

6. The plasma processing apparatus of claim 5, wherein the gas diffusion plate is made of a second conductive material.

7. The plasma processing apparatus of claim 6, wherein the first conductive material and the second conductive material are aluminum.

8. The plasma processing apparatus of claim 1, wherein the upper electrode plate has one or more heat insulating portions formed in a vicinity of the at least one coolant supply channel.

9. The plasma processing apparatus of claim 1, wherein the upper electrode plate has one or more heat insulating portions formed around the at least one coolant supply channel.

10. The plasma processing apparatus of claim 1, wherein the upper electrode plate has a central portion and an annular portion surrounding the central portion,
the one or more coolant return channels have a plurality of first segments formed at the central portion and a plurality of second segments formed at the annular portion, and
each of the plurality of first segments has a plurality of grooves.

11. The plasma processing apparatus of claim 10, wherein no groove is formed in any of the plurality of second segments.

* * * * *